United States Patent [19]

Heitmann et al.

[11] Patent Number: 4,612,267

[45] Date of Patent: Sep. 16, 1986

[54] PROCESS FOR PRODUCING STRUCTURES IN RESIST LAYERS USING ULTRASONIC IRRADIATION

[75] Inventors: Knut Heitmann; Martin Hoppe; Eckhard Schneider, all of Wetzlar; Andreas Thaer, Leihgestern, all of Fed. Rep. of Germany

[73] Assignee: Ernst Leitz Wetzlar GmbH, Wetzlar, Fed. Rep. of Germany

[21] Appl. No.: 733,188

[22] Filed: May 13, 1985

[30] Foreign Application Priority Data

May 21, 1984 [DE] Fed. Rep. of Germany ....... 3418854

[51] Int. Cl.[4] .......................... G03F 7/00; G03F 7/02; G03F 7/26
[52] U.S. Cl. ........................................ 430/3; 430/322; 430/328
[58] Field of Search ................... 430/3, 328, 325, 322, 430/326

[56] References Cited

U.S. PATENT DOCUMENTS

| | | | |
|---|---|---|---|
| 3,661,660 | 5/1972 | Wessells et al. | 430/309 |
| 4,225,658 | 9/1980 | Maskasky | 430/3 |
| 4,243,744 | 1/1981 | Lockwood et al. | 430/328 |
| 4,447,510 | 5/1984 | Frass et al. | 430/3 |
| 4,521,092 | 6/1985 | Ferrante | 430/3 |

*Primary Examiner*—Richard L. Schilling
*Attorney, Agent, or Firm*—Schwartz, Jeffery, Schwaab, Mack, Blumenthal & Evans

[57] ABSTRACT

A process for the production of structures by the polymerization, or fragmentation of resist layers comprising the steps of effecting an incomplete exposure of the resist layer corresponding to the pattern of the structures, and of fully developing the structure in the resist layer by ultrasonic irradiation.

An acoustic microscope is preferably used for the ultrasonic irradiation, whereby the formation of the structure in the resist layer may also be observed.

8 Claims, No Drawings

PROCESS FOR PRODUCING STRUCTURES IN RESIST LAYERS USING ULTRASONIC IRRADIATION

BACKGROUND OF THE INVENTION

The invention relates to a process for the production of structures by the polymerization or depolymerization of resist layers.

The term resist is defined herein as a substance capable of being applied to the surface of a substrate in order to mask the area the substance covers, i.e., to protect the substrate against the attack of, for example, etching agents, chemical or galvanic metallizing baths, or the like. Resists, such as photosensitive resists, have the property that their solubility varies under exposure to UV, electron, x-ray or ionic radiation. During exposure, either polymers are formed and cross-linked (so-called negative layers) or existing polymers are fragmented and converted into low molecular weight, soluble compounds (so-called positive layers). The property of solubility variation in the exposed, or unexposed surface areas, respectively, is utilized to produce a washout relief on the surface of the substrate by means of subsequent chemical development process.

The increasing integration density of integrated circuits requires ever-higher resolutions and lower dimensional tolerances as the field size of the structural image increases. In order to satisfy these requirements, in addition to the standard process of lithography and UV exposure, novel processes with electron beams, x-rays and ion beams are being developed. However, the smaller structural widths in the resist layers, made possible by these new processes, are attained at the price of certain, in part severe, disadvantages.

Exposure with electron radiation, using a beam directly scribing the structures, for example, has the advantage of a high resolution and low field distortion. This process is still not economical in view of the very long exposure times required. A 4" wafer may be exposed with UV radiation within a few seconds, whereas electron beam exposures usually require several tens of minutes. By projecting a mask with electron beams, shorter exposure times of approximately 2-3 minutes are obtained; however, the highest resolution is not achieved. There is also the disadvantage that expensive special electron beam masks are required.

Even x-ray lithography requires long exposure times of up to 15 minutes per 4" wafer. Furthermore, only proximity projection methods are possible in this case, and present extreme demands on the 1:1 masks used.

SUMMARY OF THE INVENTION

It is therefore an object of the present invention to provide a process whereby the exposure times of high resolution lithographic processes for resist layers, particularly lacquer layers, may be significantly reduced.

In accordance with the above object, there has been provided a process for the production of structures in a resist layer, comprising the steps of (a) initiating a selected structure by incompletely exposing a resist layer to a first radiation with a pattern corresponding to the selected structure, and (b) developing the structure by exposing the resist layer to ultrasonic irradiation.

In one embodiment of the present invention, the developing step comprises integrally exposing the entire resist layer to ultrasonic irradiation. According to the invention, the steps of initiating and developing may be effected substantially at the same time and from opposite sides of said resist layer, or the steps may be effected in succession. The developing step may comprise scanning the resist layer in a grid-like manner with a finely directed ultrasonic beam.

In an advantageous embodiment, the developing step is effected using an acoustic microscope. According to this embodiment, the process may further comprise the steps of displaying an image of the structure originating from the acoustic microscope coincident with the developing step, and terminating the developing step as a function of the image. Furthermore, the developing step may comprise selectively ultrasonically irradiating individual structural elements of said structure.

Also according to the invention, the process may further comprise the step of determining an ultrasonic frequency and intensity of ultrasonic irradiaton as a function of a line width of the structure and a thickness of the resist.

DETAILED DESCRIPTION OF THE PREFERRED EMBODIMENTS

The invention is based on the observation that the time factor in the known lithographic processes is essentially determined by the polymerization, or depolymerization process, respectively, penetrating the lacquer layer. It has been surprisingly discovered that even an "illumination" of the lacquer layer is sufficient to fix the structure desired therein, and that by means of a subsequent ultrasonic irradiation, for example, the "through exposure" of the lacquer layer may be effected without reducing the original resolution. With the aid of the known lithographic processes, it is thus necessary merely to initiate the structures desired in the lacquer layer. This discovery leads to a substantial reduction of the processing times for the lithographic equipment. Time consuming cross-linking, or fragmentation through the entire thickness of the lacquer layer to the substrate layer is left to much simpler ultrasonic irradiation. Ultrasonic irradiation could be effected over the entire surface to be exposed, initiated during the lithographic process, and even applied from the reverse side of the lacquer layer.

Particular advantages are obtained by using a finely directed ultrasonic beam which scans the lacquer layer in the form of a grid. A known acoustic lens system may be used for directing the ultrasonic beam. A linear, focused ultrasonic beam may thus be produced.

As the incomplete lithographic exposure and the ultrasonic irradiation are physically independent of each other, the two process steps may be carried out successively in time and even in different apparatae. An acoustic microscope is especially advantageous for the realization of the second process step. By means of the acoustic microscope, the degree of cross-linking or fragmentation may be visually displayed prior to the chemical development of the resist layer. In this manner, defects of the structure may be recognized and extensively corrected by means of a selective, locally more intensive ultrasonic irradiation. The completion of the irradiation may be determined as a function of the image displayed.

By observing the progress of cross-linking or fragmentation in the resist layer with the aid of an acoustical microscope, the most favorable ultrasonic frequencies and intensities for the irradiation may be determined as a function of line width, the structural elements of the layer thickness and the specific material of the resist.

Coupling the ultrasonic beam from the acoustic lens assembly to the surface of the resist is effected, in the known manner, by means of an interposed immersion agent, such as water.

What is claimed is:

1. A process for the production of structures in a resist layer, comprising the steps of:
   (a) initiating a selected structure by incompletely exposing a resist layer to a first radiation with a pattern corresponding to the selected structure; and
   (b) developing the structure by exposing the resist layer to ultrasonic irradiation;
   wherein said developing step comprises scanning the resist layer in a grid-like manner with a finely directed ultrasonic beam.

2. A process as recited in claim 1, wherein said developing step comprises integrally exposing the entire resist layer to ultrasonic irradiation.

3. A process as recited in claim 1, wherein said steps of initiating and developing are effected substantially at the same time and from opposite sides of said resist layer.

4. A process as recited in claim 1, wherein said initiating and developing steps are effected in succession.

5. A process as recited in claim 1, further comprising the step of determining an ultrasonic frequency and intensity of ultrasonic irradiation as a function of a line width of said structure and a thickness of said resist.

6. A process for the production of structures in a resist layer, comprising the steps of:
   (a) initiating a selected structure by incompletely exposing a resist layer to a first radiation with a pattern corresponding to the selected structure; and
   (b) developing the structure by exposing the resist layer to ultrasonic irradiation;
   wherein said developing step is effected using an acoustic microscope.

7. A process as recited in claim 6, further comprising the steps of displaying an image of said structure originating from said acoustic microscope coincident with said developing step, and terminating the developing step as a function of said image.

8. A process as recited in claim 7, wherein said developing step comprises selectively ultrasonically irradiating individual structural elements of said structure.

* * * * *